United States Patent [19]

Anzai et al.

[11] Patent Number: 5,682,226
[45] Date of Patent: Oct. 28, 1997

[54] PHOTOMASK, AN EXPOSURE METHOD AND A PROJECTION EXPOSURE APPARATUS

[75] Inventors: Satoru Anzai, Ebina; Masaya Komatsu, Tokyo, both of Japan

[73] Assignee: Nikon Corporation, Tokyo, Japan

[21] Appl. No.: 731,917

[22] Filed: Oct. 22, 1996

Related U.S. Application Data

[62] Division of Ser. No. 573,760, Dec. 18, 1995, Pat. No. 5,592,259, which is a continuation of Ser. No. 395,188, Feb. 27, 1995, abandoned, which is a continuation of Ser. No. 110,207, Aug. 23, 1993, abandoned, which is a continuation of Ser. No. 924,642, Aug. 4, 1992, abandoned.

[30] Foreign Application Priority Data

Aug. 9, 1991 [JP] Japan ................................. 3-200580
Oct. 14, 1991 [JP] Japan ................................. 3-292063

[51] Int. Cl.$^6$ .................. G03B 27/42; G03B 27/52; G03B 27/72
[52] U.S. Cl. .................. 355/53; 355/53; 355/67; 355/71; 359/586
[58] Field of Search .................. 355/53, 67, 71; 359/586, 737, 368, 721; 430/5

[56] References Cited

U.S. PATENT DOCUMENTS

| | | | |
|---|---|---|---|
| 4,338,647 | 7/1982 | Nakagawa et al. | 430/5 |
| 5,045,417 | 9/1991 | Okamoto | 430/5 |
| 5,140,366 | 8/1992 | Shizowa et al. | 355/53 |
| 5,227,838 | 7/1993 | Nakanishi et al. | 355/53 |
| 5,284,724 | 2/1994 | Noelscher et al. | 430/5 |
| 5,592,259 | 1/1997 | Banks | 355/53 |

*Primary Examiner*—R. L. Moses
*Assistant Examiner*—Shival Virmani
*Attorney, Agent, or Firm*—Shapiro and Shapiro

[57] ABSTRACT

A photomask is provided having a stepped portion formed on at least one of a first and second areas corresponding to a stepped structure within an exposure area on the sensitive substrate onto which the pattern is to be exposed to make different height positions of the first and second areas of the pattern forming surface of the transparent substrate in the optical axis direction of the projection optical system. Also provided is an exposure method involving the step of shifting an image forming surface of a projection optical system in an optical axis direction corresponding to a stepped structure of an exposure area on a sensitive substrate. The image forming surface of the projection optical system coincides with the exposure area surface when exposing the pattern on an original substrate onto the sensitive substrate through the projection optical system. A projection exposure apparatus is also provided including a projection optical system for projecting and forming an image of a pattern on the original substrate on the sensitive substrate, and a stage for retaining the sensitive substrate so that the surface of the sensitive substrate is disposed close to the image forming surface. The exposure apparatus also has an image surface compensating member for shifting the image forming surface in the optical axis direction corresponding to the stepped structure.

6 Claims, 7 Drawing Sheets

PHOTOMASK, AN EXPOSURE METHOD AND A PROJECTION EXPOSURE APPARATUS

This is a division of application Ser. No. 08/573,760 filed Dec. 18, 1995, now U.S. Pat. No. 5,592,259 which is a continuation of application Ser. No. 08/395,188 filed Feb. 27, 1995 (abandoned), which is a continuation of application Ser. No. 08/110,207 filed Aug. 23, 1993 (abandoned), which is a continuation of application Ser. No. 07/924,642 filed Aug. 4, 1992 (abandoned).

BACKGROUND OF THE INVENTION

1. Field of the Invention

The present invention relates to a photomask, an exposure method and a projection exposure apparatus which are employed in lithography steps of manufacturing, e.g., a semiconductor element and a liquid crystal display element.

2. Related Background Art

In recent years, there have been often utilized a scale-down projection type exposure apparatus (stepper) of a step-and-repeat system as a device for transferring a pattern on an original substrate (mask or reticle) onto a sensitive substrate (such as a semiconductor wafer or the like having its surface formed with a resist layer) with a high resolving power in lithography steps. In this kind of stepper, a projection optical system undergoes a good compensation of chromatic aberration with respect to a wavelength of exposure light. The reticle and the wafer are so disposed as to be conjugate to each other under an exposure wavelength thereof. The lower surface (pattern forming surface) of the reticle is substantially flat planar, and a projection image surface (best image forming surface) of the projection optical system is also substantially flat.

The device described above, however, presents the following problems. Normally, the surface of one exposure area on the wafer is nearly flat. In this case, there is no problem when the image forming surface of the projection optical system is flat. However, in some cases, the exposure area partially has a step (rugged structure). In such an instance, when the image forming surface of the projection optical system is substantially flat as in the prior art, if focused on the upper surface of the step i.e., the image forming surface coincides with the upper surface of the step, an image forming performance on the lower surface of the step is deteriorated. Especially when a focal depth of the projection optical system is smaller than the step, a resolution on the lower surface of the step is deteriorated. Conversely, if focused on the lower surface of the step, the image forming performance on the upper surface of the step is deteriorated. Further, if focused on a mid-point between the upper and lower surfaces, there arises such a defect that sufficient image forming performance cannot be obtained both on the upper surface and on the lower surface.

Even if the wafer exposure area) is substantially flat, when a distortion is caused on the image surface due to an aberration (curvature of field, etc.) of the projection optical system or a curvature of the reticle itself (including a deflection by a tare weight), the image forming performance may decline because of a partial deviation between the image forming surface of the projection optical system and the surface of the exposure area (a part of the surface of the exposure area deviates from the focal depth). Moreover, a numerical aperature (NA) of the projection optical system increases corresponding to a demand for a hyperfine pattern, and there exists a tendency in which an exposure wavelength is shortened. For this reason, the focal depth of the projection optical system has been reduced from year to year. The deterioration of resolution due to the ruggedness of the wafer and the distortion of the image surface occurs easily as a result.

SUMMARY OF THE INVENTION

It is a general object of the present invention, which has been devised in view of the foregoing points, to provide a photomask, an exposure method and a projection exposure apparatus which are capable of performing a high-resolution pattern exposure on an entire surface of an exposure area even when a step (ruggedness) is present within the exposure area on a sensitive substrate, or a distortion (ruggedness on an image surface) is caused on a pattern image through a projection optical system.

In accordance with one aspect of the invention, there is provided a photomask defined as a transparent substrate including a pattern assuming a predetermined configuration and used for exposing the pattern onto a sensitive substrate through a projection optical system, the photomask comprising: a stepped portion formed on at least one of first and second areas corresponding to a stepped structure within an exposure area on the sensitive substrate onto which the pattern is to be exposed so as to make different height positions of the first and second areas within the pattern forming surface of the transparent substrate in the optical axis direction of the projection optical system.

In accordance with another aspect of the invention, there is provided a photomask defined as a transparent substrate including a pattern assuming a predetermined configuration and used for exposing the pattern onto a sensitive substrate through a projection optical system, the photomask comprising: a light transmission member provided on at least a part of the pattern forming surface of the transparent substrate corresponding to a stepped structure within an exposure area on the sensitive substrate onto which the pattern is to be exposed and having a refractive index corresponding to a stepped quantity within the exposure area and/or a distortion quantity of an image forming surface of the projection optical system in the optical axis direction.

In accordance with a further aspect of the invention, there is provided an exposure method comprising the step of: shifting at least a part of an image forming surface of a projection optical system in an optical axis direction in accordance with a stepped structure within an exposure area on a sensitive substrate onto which a pattern is to be exposed so that the image forming surface of the projection optical system coincides substantially with the surface of the exposure area when exposing the pattern formed on an original substrate onto the sensitive substrate through the projection optical system.

In accordance with yet another aspect of the invention, there is provided a projection exposure apparatus comprising: a projection optical system for projecting and forming an image of a pattern formed on an original substrate on a sensitive substrate; and a stage for retaining the sensitive substrate so that the surface of the sensitive substrate is disposed in the vicinity of an image forming surface of the projection optical system, characterized by an image surface compensating member for shifting at least a part of the image forming surface of the projection optical system in an optical axis direction of the projection optical system in accordance with a stepped structure within an exposure area so that the image forming surface of the projection optical system coincides substantially with the surface of the exposure area.

Now, the operation of the present invention will be explained with reference to FIG. 2. Referring to. FIG. 2, a step (ruggedness) is formed on a mask (glass substrate such as quartz that is almost transparent to an exposure wavelength) on the pattern forming surface (lower surface) of a photomask 20' so that height positions in the optical axis direction of a projection optical system 3 are made different by $D_1$. Luminous fluxes $IL_1$, $IL_2$ are emitted respectively from points (pattern forming surface) $A_1$, $A_2$ between which the height positions in the optical axis direction are made different by $D_1$. It follows that these luminous fluxes $IL_1$, $IL_2$ form image points at points $B_1$, $B_2$ between which positions (image forming positions) in the optical axis direction made different by $\Delta d_1$ through the projection optical system 3 having a projection magnification m. At this time, the following formula (1) is established:

$$\Delta d_1 = D_1 \cdot m^2 \qquad (1)$$

Then, if a step defined by $D_1 = \Delta d_1 / m^2$ is formed on the photomask itself so that $\Delta d_1$ in the above-described formula (1) is equivalent to the step of the exposure area on the sensitive substrate, it is possible to make the exposure area (e.g., its surface) assuming a stepped structure (ruggedness) coincident exactly with the image forming surface of the projection optical system.

Further, another operation of the present invention will be described with reference to FIG. 6. Referring to FIG. 6, transparent films 1a, 1b having a constant thickness but different refractive indexes are deposited on a predetermined portion on the pattern forming surface of the photomask 1. The luminous fluxes $IL_1$, $IL_2$ emitted respectively from the points $A_1$, $A_2$ on the pattern forming surface and penetrating the transparent films 1a, 1b form image points respectively at $B_1$, $B_2$ through the projection optical system 3 having the projection magnification m. This arrangement causes a difference in light path between the luminous fluxes $IL_1$ and $IL_2$. For this reason, as illustrated in FIG. 6, it follows that the image forming positions $B_1$, $B_2$ in the optical axis direction of the projection optical system are made different by $\Delta d_2$.

At this time, the following formula (2) is established:

$$\Delta d_2 = [\Delta n / (n_1 \cdot n_2)] \cdot D_2 \cdot m^2 \qquad (2)$$

where $n_1$, $n_2$ ($n_2 > n_1$) are the refractive indexes of the transparent films 1a, 1b,; $D_2$ is the film thickness. ; $\Delta n = n_2 - n_1$; and m is the projection magnification of the projection optical system 3.

Then, the refractive indexes and the thickness of the transparent films 1a, 1b are so selected that $\Delta d_2$ in the foregoing formula (2) is equivalent to the step of the exposure area. For instance, the transparent film 1a is deposited on a portion corresponding to a recess (lower surface of the step) of the exposure area, while the transparent film 1b is deposited on a portion corresponding to a protrusion (upper surface of the step) of the exposure area. With this arrangement, a good image forming performance can be obtained with respect to the recess and the protrusion. Namely, the exposure area coincides exactly with the image forming surface of the projection optical system.

As has been explained in accordance with the present invention, the step is partially formed on the photomask (pattern forming surface); or the transparent films having the predetermined refractive indexes and thickness are deposited on the pattern forming surface, Whereby the image forming surface of the projection optical system is allowed to partially deviate in the optical axis direction. Hence, even in the case of the step existing within the exposure area on the sensitive substrate, it is feasible to simultaneously effect focusing on the upper surface and on the lower surface of the step. In other words, the entire surface of the exposure area can be made coincident precisely with the image forming surface of the projection optical system.

It will be appreciated that, if main beams of the luminous flux penetrating the photomask 1, 20' and incident on the projection optical system 3 and the luminous flux emitted from the projection optical system 3 are inclined to the optical axis, a size (magnification) of the a projection image varies with a deviation of the image forming surface in the optical axis direction. Hence, it is desirable that the projection optical system 3 be telecentric on both sides.

As earlier noted, the sensitive substrate (exposure area) may be substantially flat, and the image forming surface of the projection optical system distorted in the optical axis direction due to a deflection by the tare weight of the photomask, an aberration, etc. In this case, if the stepped quantity $D_1$ of the photomask or the refractive indexes and thickness of the transparent films 1a, 1b are determined so that $d_1$, $d_2$ correspond to the difference (distortion quantity) between the positions on the image forming surface in the optical axis direction, the distortion of the image forming surface can be compensated. The entire exposure area thereby coincides exactly with the image forming surface. For instance, with respect to a protruded portion of the image forming surface towards the projection optical system, the pattern forming surface of the photomask is protruded towards the projection optical system; or, alternatively a transparent film 1a having a small refractive index may be deposited. On the other hand, with respect to a recessed portion of the image forming surface, the pattern forming surface may be recessed; or, alternatively, a transparent film 1b having a large refractive index may be deposited.

If the above-mentioned distortion is caused on the image forming surface, and the sensitive substrate takes the stepped structure, the stepped quantity $D_1$ of the photomask, or the refractive indexes and thickness of the transparent films 1a, 1b may be determined in view of the two factors. It is noted that for the sake of simplicity, the explanation of FIG. 6, has assumed that transparent films 1a, 1b having the same thickness but different refractive indexes are deposited on the pattern forming surface, thereby partially shifting the image forming surface in the optical axis direction. The thicknesses of the transparent films to be deposited need not be the same, however.

Further, in FIGS. 2 and 6, with respect to the stepped structure (ruggedness) of the exposure area and the distortion of the image forming surface, there are taken a measure to form a step on the photomask itself or to provide the transparent films having different refractive indexes and/or thicknesses. However, it is not necessary to form the transparent film (FIG. 6) or the step (FIG. 2) directly on the pattern forming surface. Namely, the entire exposure area can be made coincident with the image forming surface as in FIGS. 2 and 6 by placing an image surface compensating member having the step corresponding to the ruggedness of the exposure area and/or the distortion of the image forming surface or a distribution of refractive indexes in the vicinity of the projection optical system of the photomask (pattern forming surface) of the projection, exposure apparatus.

Further, the films (transparent films 1a, 1b of FIG. 6) provided for shifting the image forming surface of the projection optical system in the optical axis direction may be transparent to the exposure light. The films may involve the use of, e.g., glass, quartz, PMMA and fluororesin, but are not limited to these. A desired distribution of refractive indexes can be provided by ion implantation into a specific portion of the transparent film, or by selectively accumulating substances having different refractive indexes with a photoresist serving as a mask, or, contrastingly, by etching an unnecessary portion.

As described above, according to the present invention, the step corresponding to the stepped structure of the sensitive substrate and/or the distortion of the image forming surface is formed on the side of the pattern forming surface of the photomask, or the distribution of refractive indexes is provided thereon. As a result a good image quality pattern can be formed over the entire exposure area in cases where the sensitive substrate (exposure area) has the stepped structure over a wide range, and the image forming surface is distorted due to the aberration of the projection optical system and the deflection of the photomask.

BRIEF DESCRIPTION OF THE DRAWINGS

Other objects and advantages of the present invention will become apparent during the following discussion taken in conjunction with the accompanying drawings, in which.

DESCRIPTION OF THE PREFERRED EMBODIMENTS

Figure 1:
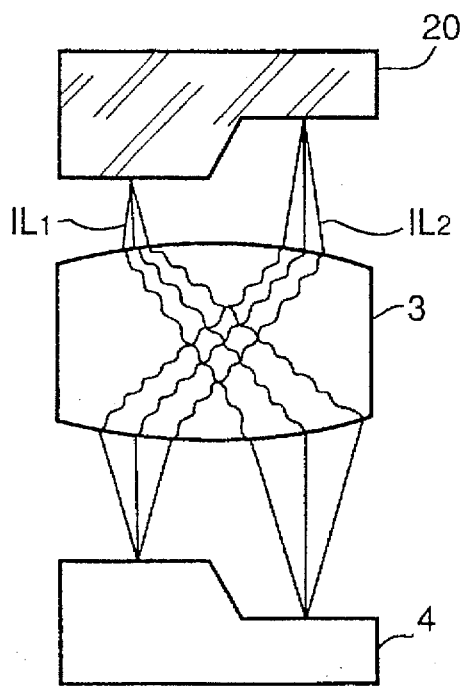
FIG. 1 is a view showing the case of a projection exposure by use of a photomask in a first embodiment of the present invention.
Figure 2:
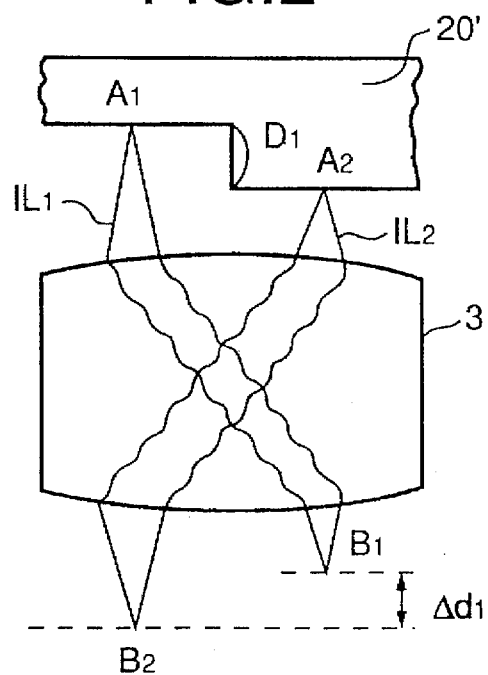
FIG. 2 is a conceptual view of assistance in explaining the operation of the present invention.

A first embodiment of the present invention will be described with reference to FIGS. 1 and 2. In accordance with this embodiment, as was earlier explained in connected with FIG. 2, a stepped portion is formed in a photomask (pattern forming surface) itself. As depicted in FIG. 1, a sensitive substrate (wafer having a surface formed with a resist layer) 4 takes a stepped structure. Made different corresponding to a stepped quantity (herein, $\Delta d_1$) are height positions of a first area (including a point $A_1$) and a second area (including a point $A_2$) within the pattern forming surface in the optical axis direction of a projection optical system 3. Namely, a difference (interval) $D_1$ between the positions of the first and second areas in the optical axis direction is expressed as $D_1 = \Delta d_1/m^2$. An image forming surface (projection image surface of a reticle pattern) of the projection optical system 3 is thereby partially shifted in the optical axis direction. It follows that the image forming surface of the projection optical system 3 coincides substantially with an entire exposure area.

For instance, assume that a projection magnification m of the projection optical system 3 is 1/5 (m=0.2) in FIG. 1. If a step on the order of 1 µm is provided on a wafer 4, a step on the order of 25 µm may be provided on the photomask. In this case, if the pattern of the photomask 20 is continual on both sides (the first and second areas) of the stepped portion, the step of the wafer 4 typically assumes not a rectangular shape but an inclination, and it is therefore desirable that the stepped portion formed in the photomask 20 be inclined corresponding to the inclination of the step on the wafer 4.

Figure 3A:
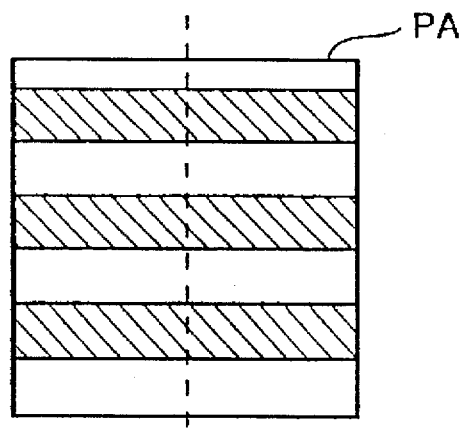
FIG. 3A is a plan view showing a pattern forming area of the photomask used in a second embodiment of the present invention.
Figure 3B:
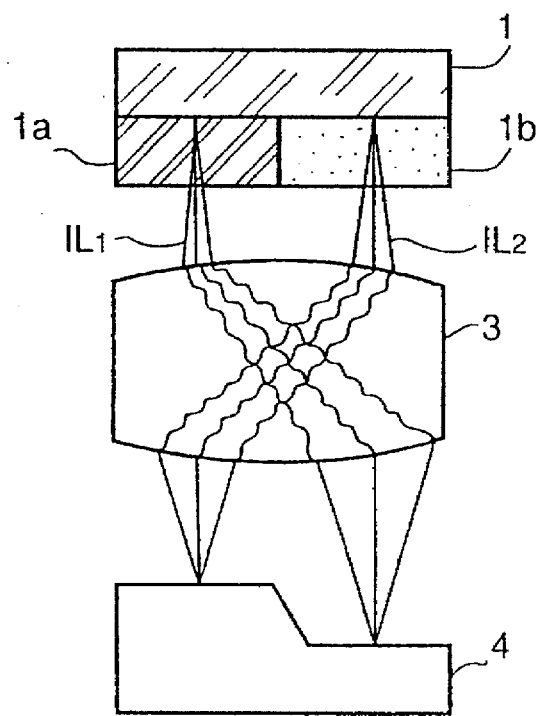
FIG. 3B is a view illustrating the case of a projection exposure by use of the photomask in the second embodiment of the present invention.

Next, a second embodiment of the present invention will be explained with reference to FIGS. 3A and 3B. FIG. 3A is a plan view depicting a pattern forming area PA of the photomask employed in this embodiment. It is assumed that the pattern formed herein is a line-and-space pattern having an on-the-mask dimension of 2.5 µm. FIG. 3B is a conceptual diagram showing a situation where a projection exposure is effected by use of the photomask in accordance with this embodiment.

Referring to FIG. 3B, it is presumed that a step on the order of 0.1 µm is formed on a portion of the wafer 4 which corresponds to a dotted line in FIG. 3A. The projection exposure is performed by employing the 1/5 scale-down projection optical system 3. Herein, transparent films $1a$, $1b$ each having a thickness of 100 µm are formed on the pattern forming surface of the photomask 1, thus corresponding to the step of the wafer 4. Refractive indexes $n_1$, $n_2$ of the transparent films $1a$, $1b$ are in the vicinity of 1.5. When $n_1 < n_2$, it follows from the above-mentioned formula (2) that $n_1 = 1.5$, $n_2 = 1.55$, and $\Delta n = 0.05$. Namely, the transparent film $1a$ having the refractive index of 1.5 may be deposited on the portion corresponding to the recess of the wafer 4 on the pattern forming surface of the photomask 1 in FIG. 3B. The transparent film $1b$ having the refractive index of 1.55 may be deposited on the portion corresponding to the protrusion of the wafer 4.

When effecting the projection exposure by use of the thus configured photomask, a luminous flux $IL_1$ penetrating the transparent film $1a$ forms an image point on the recess of the wafer 4. On the other hand, a luminous flux $IL_2$ penetrating the transparent film $1b$ forms an image point on the protrusion of the wafer 4. Hence, the entire exposure area coincides with the image forming surface, thereby obtaining a good image forming performance.

Figure 7:
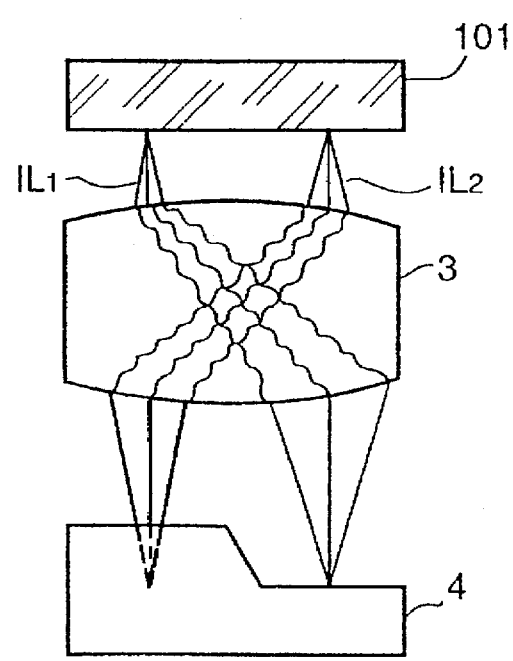
FIG. 7 is a conceptual view illustrating a situation of the projection exposure by use of a conventional photomask.

In contrast, FIG. 7 illustrates a situation where the projection exposure is executed under the same conditions as those of the second embodiment discussed above, but by using the conventional photomask 101. As illustrated in FIG.

7, if the image forming surface is matched with the recess of the wafer 4, the protrusion of the wafer 4 does not match with the image forming surface, with the result that the good image forming performance can not be obtained in the entire exposure area.

Figure 4:
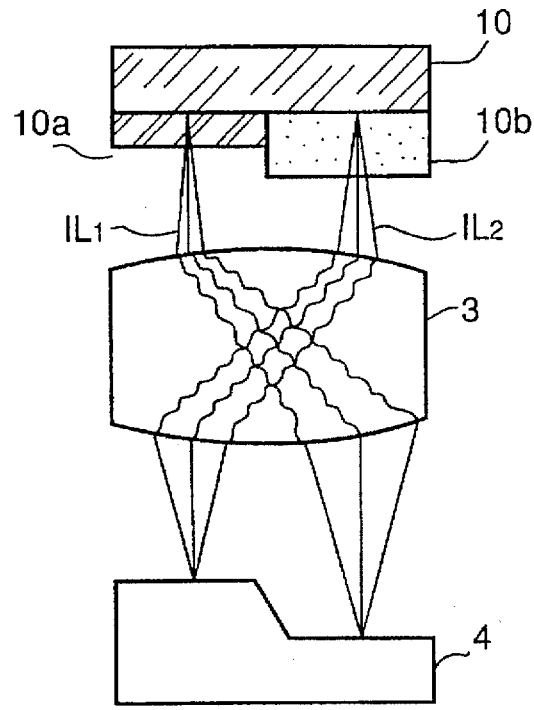
FIG. 4 is a view showing the case of a projection exposure by use of the photomask in a third embodiment of the present invention.
Figure 6:
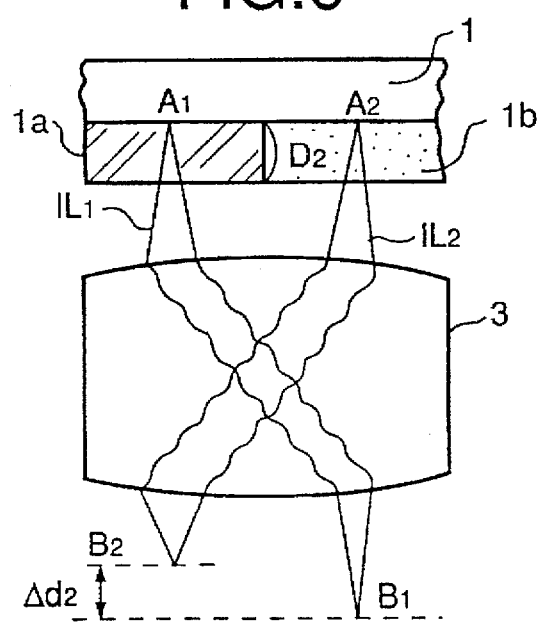
FIG. 6 is a conceptual view of assistance in explaining another operation of the present invention.

Next, a third embodiment of the present invention will be described with references to FIG. 4. FIG. 4 depicts a situation where the projection exposure is performed by the same exposure apparatus as that of the second embodiment with the aid of the photomask in accordance with this embodiment. In this embodiment, not only the refractive indexes but also thicknesses of transparent films 10a, 10b formed on the pattern forming surface (lower surface) of a photomask 10 are changed corresponding to a ruggedness of the wafer 4. The thicknesses of the transparent films 10a, 10b may be adjusted when forming the films or after forming the films by reducing the film thicknesses of a specific portion with etching. In accordance with this embodiment, the refractive indexes and the film thicknesses are adjusted, whereby the entire exposure area can be, just as in the preceding embodiment, made coincident with the image forming surface.

Next, a fourth embodiment of the present invention will be described with reference to FIGS. 5A and 5B. This embodiment will deal with a case where transparent films (refractive indexes are fixed) having different thicknesses are formed on the photomask. Referring to FIG. 5B, luminous fluxes $IL_1$, $IL_2$ are emitted from two points $A_1$, $A_2$ between which a difference in thickness of a transparent film $30a'$ deposited on the pattern forming surface of a photomask $30'$ is produced. If it is assumed that the luminous fluxes $IL_1$, $IL_2$ form image points of two points B1, B2 which differ by $\Delta d_3$ in the optical axis direction through the projection optical system 3 having a projection magnification m, the following formula (3) is established.

$$\Delta d_3 = [(n-1)/n] \Delta D \cdot m^2 \quad (3)$$

where n is the refractive index of the transparent film $30a'$ and 1 is the refractive index of air.

Hence, when adjusting the difference in thickness of the transparent film $30a'$ so that $\Delta d_3$ is set to a value corresponding to the step of the wafer, the entire exposure area can be made coincident exactly with the image forming surface even in the case of the rugged exposure area.

Figure 5A:
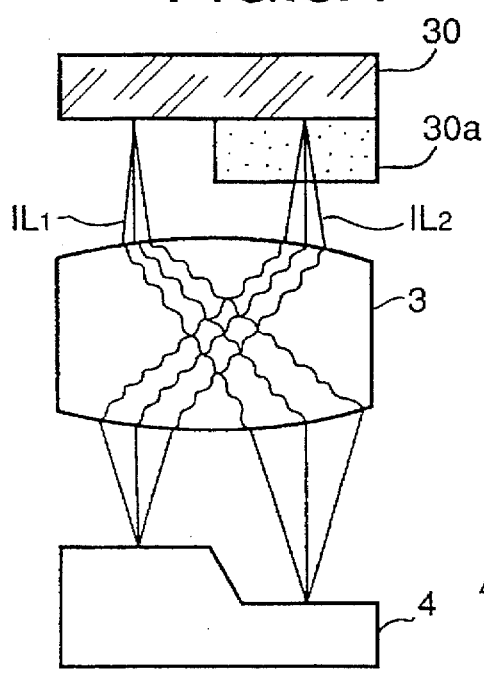
FIGS. 5A and 5B are views each illustrating the case of a projection exposure by use of the photomask in a fourth embodiment of the present invention.
Figure 5B:
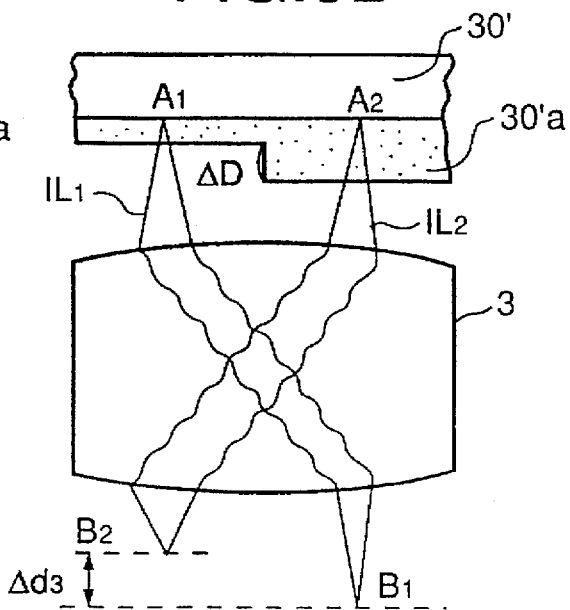

For example, referring to FIG. 5A, the projection magnification m of the projection optical system 3 is 1/5 (m=0.2); the step of the wafer 4 is 0.5 µm; and the refractive index of the transparent film 30a is 1.5. It can be understood from the formula (3) that a difference $\Delta D$ (herein, film thickness) in thickness of the transparent film 30a may be set to 37.5 µm. In FIG. 5A, the transparent film 30a is formed on only the portion corresponding to the protrusion of the wafer 4 on the pattern forming surface.

Figure 8:
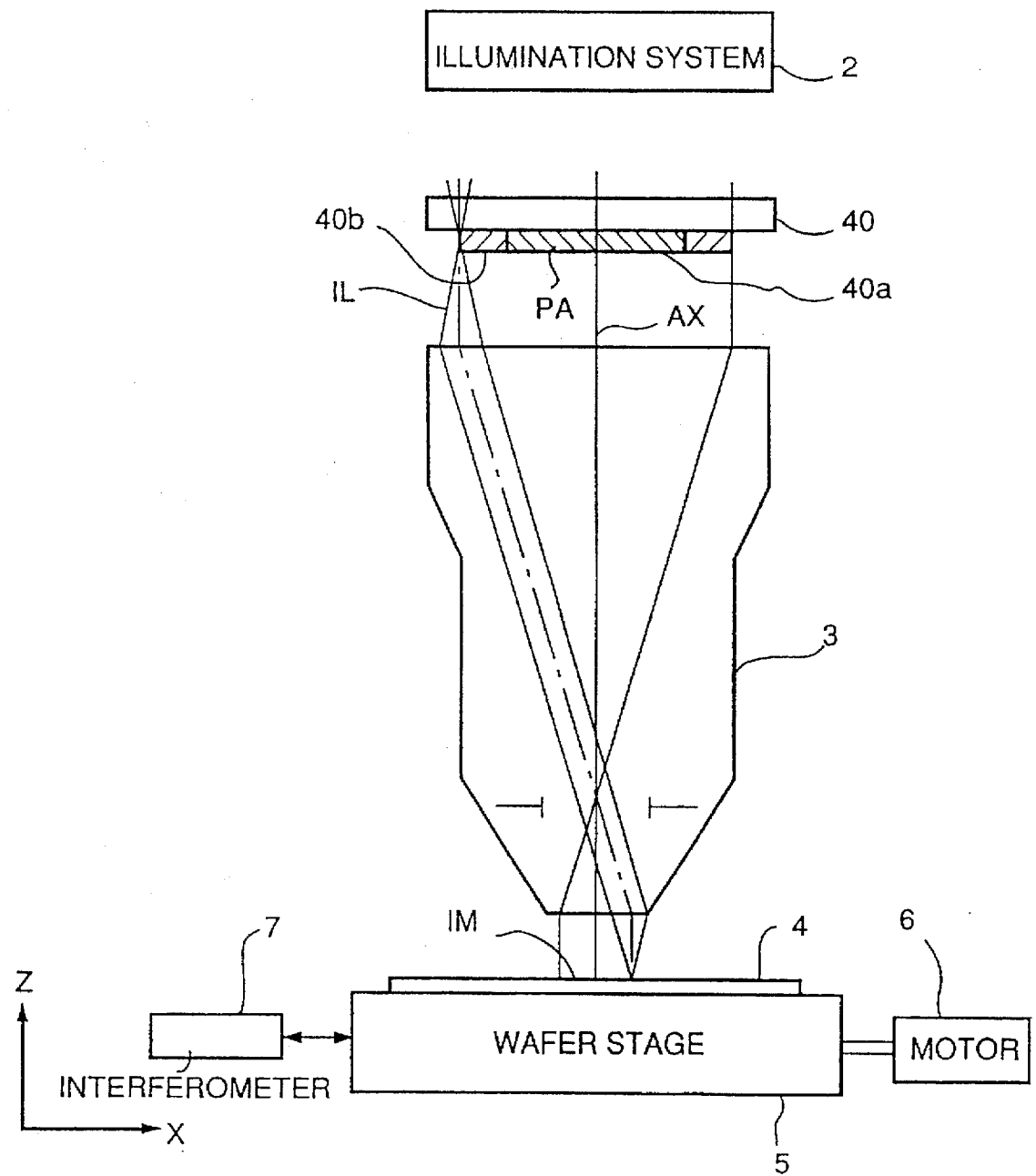
FIG. 8 is a view schematically depicting a construction of a projection exposure apparatus of a fifth embodiment of the present invention.

Next, a fifth embodiment of the present invention will be described with reference to FIG. 8. FIG. 8 is a schematic elevational diagram illustrating projection exposure apparatus in this embodiment.

Referring to FIG. 8, an illumination system 2 includes a light source for exposure such as an ultra high pressure mercury lamp, etc. and an optical integrator, etc.. The illumination system 2 irradiates a photomask 40 (hereinafter referred to as a reticle) with an exposure illumination light IL having a substantially uniform illuminance. The exposure light IL passing through a pattern forming area PA of the reticle 40 is incident on the projection optical system 3 that is telecentric on both sides. The projection optical system 3 projects and forms an image of a pattern formed of a light shielding layer such as chrome on the lower surface of the reticle 40 on the wafer 4 having its surface formed with the resist layer. Note that the reticle 40 is employed as an image surface compensating member in this embodiment, and this will hereinafter be explained in detail.

Where m is the projection magnification of the projection optical system 3, as a matter of course, a size of the pattern of the reticle 40 is 1/m as small as the pattern to be formed on the wafer 4. The projection optical system 3 is so disposed that a chromatic aberration is well compensated with respect to the wavelength of the exposure light IL, and the reticle 40 and the wafer 4 are conjugate to each other under the exposure wavelength thereof.

Further, the wafer 4 is placed on a wafer stage 5 which moves two-dimensionally by a motor 6 in accordance with a step-and-repeat system. When finishing a transfer exposure of the reticle 40 to one exposure area on the wafer 40, the wafer stage 5 is moved stepwise to a position of the next exposure area. Herein, the wafer stage 5 retains the wafer 4 so that the surface of the wafer 4 is disposed in the vicinity of an image forming surface IM of the projection optical system 3. Two-dimensional positions of the wafer stage 5 are constantly detected by an interferometer 7 with a resolving power on the order of, e.g., 0.01 µm.

Figure 10A:
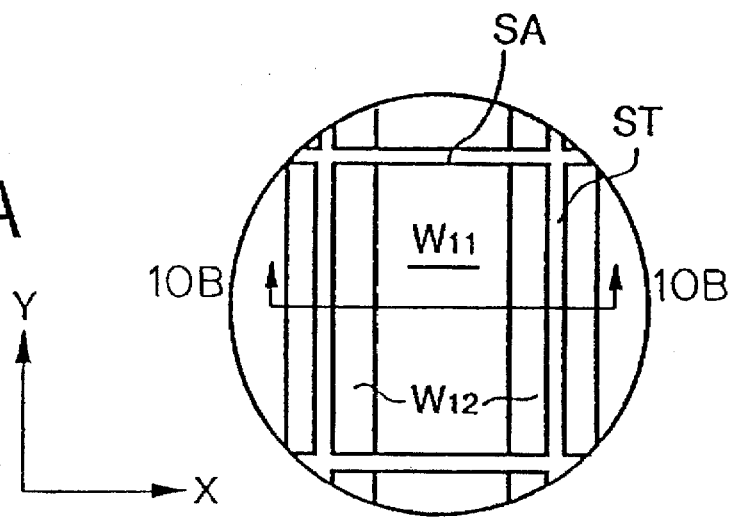
FIGS. 10A and 10B are views showing a configuration of one area among a plurality of exposure area formed on the sensitive substrate.
Figure 10B:
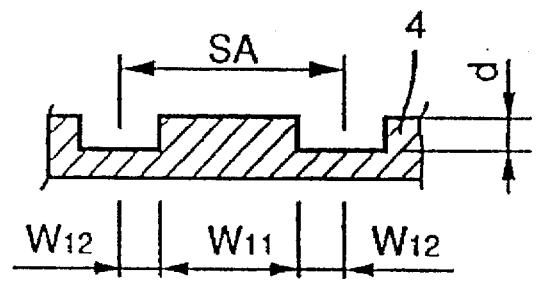

FIG. 10A illustrates one area SA among a plurality of exposure areas formed on the wafer 4. Street lines ST each having a width of generally 50–100 µm are formed along circumferential four sides of one exposure area SA. The street lines ST serve as cut-allowances used for cutting out a chip of the wafer. A part of the circuit pattern is not formed beyond the street lines at all. FIG. 10B is a sectional view taken substantially along the arrowed lines 10B—10B of FIG. 10A, showing that the exposure area SA partially takes a stepped structure. Note that d represents a step (interval) between segmental areas $W_{11}$ and $W_{12}$ within the exposure area SA.

Figure 11:
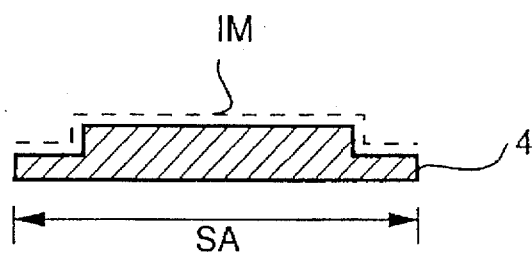
FIG. 11 is a sectional view showing how an image forming surface is compensated corresponding to a stepped structure of the exposure area.

Now, as described above, the exposure area SA partially assumes the stepped structure, and therefore, as in the same way with the second embodiment (FIG. 3B), areas (corresponding to areas $R_{11}$, $R_{12}$ in FIG. 9B) having different refractive indexes are formed on the pattern forming surface of the reticle 40 while corresponding to the stepped structure of the exposure area SA in this embodiment (FIG. 8). A part of the image forming surface IM (i.e., projection image surface of the reticle pattern) of the projection optical system 3 is thereby shifted in the direction (Z-direction) along an optical axis AX. It follows that the image forming surface IM of the projection optical system 3 substantially coincides with the entire surface of the exposure area SA (FIG. 11). Hence, in accordance with this embodiment, the reticle 40 including the areas having different refractive indexes on the pattern forming surface is used as the image surface compensating member according to the present invention.

Figure 9A:
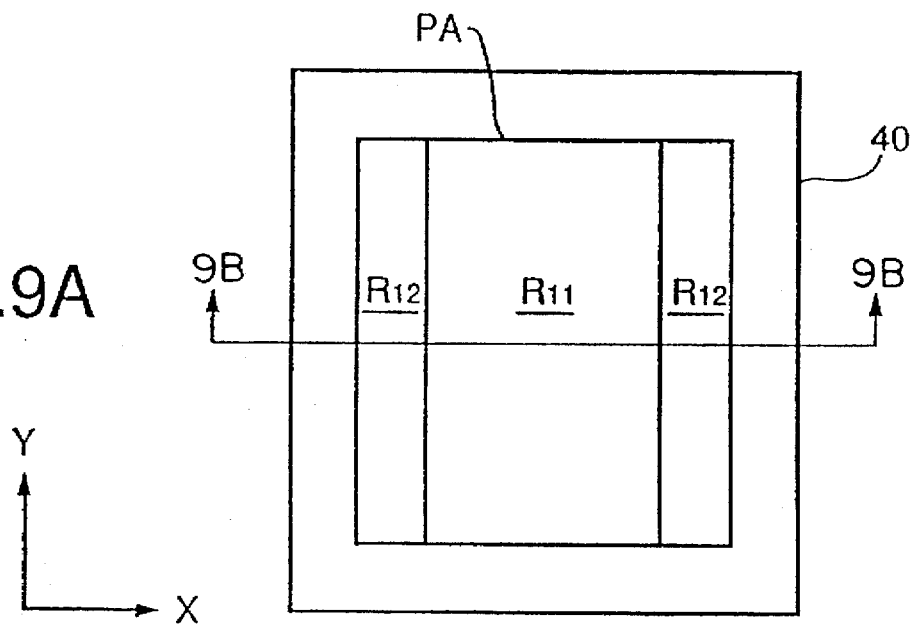
FIGS. 9A, 9B and 9C are views showing one example of a specific construction of the photomask (image surface compensating member) employed in the exposure apparatus shown in FIG. 8.
Figure 9B:
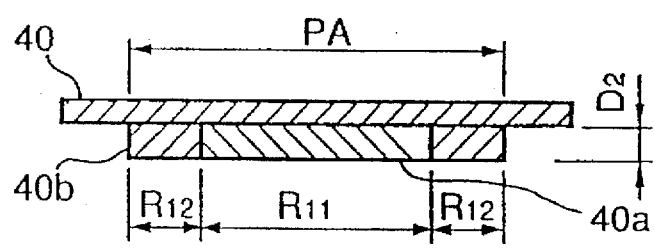

FIG. 9A shows one example of a specific configuration suitable for the reticle 40 in this embodiment. FIG. 9B is a sectional view taken substantially along the arrowed lines 9B—9B of FIG. 9A. As depicted in FIGS. 9A and 9B, the areas $R_{11}$, $R_{12}$ having different refractive indexes corresponding to the stepped structure of the exposure area SA are formed on the pattern forming surface of the reticle 40. To be specific, on the basis of the step (interval d) within the exposure area SA shown in FIG. 10B, transparent films 40a, 40b having refractive indexes different from each other are deposited respectively on the first area $R_{11}$ corresponding to the segmental area (protruded portion) $W_{11}$ within the pattern forming area PA and on the second area $R_{12}$ corresponding to the segmental area (recessed portion) $W_{12}$. Herein, a difference Δn in refractive index between the transparent films 40a, 40b and a film thickness $D_2$ thereof are set to satisfy the above-mentioned formula (2). However, an optimum value of $D_2$ may vary due to influences of a thickness of the resist layer, a type of the resist and a matrix and density of the pattern. It is therefore desirable that the optimum value be predetermined for every reticle beforehand by performing tests or simulations.

Figure 9C:
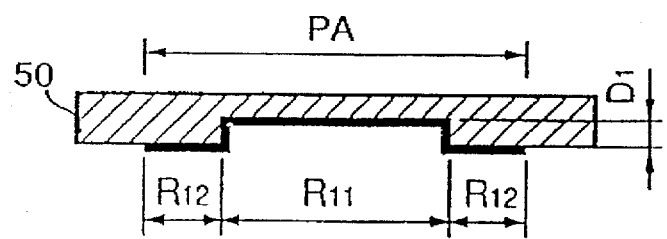

It is to be noted that a reticle 50 shown in FIG. 9C may be employed in place of the reticle 40 described above. Referring to FIG. 9C, a step is partially formed on the pattern forming surface of the reticle 50, corresponding to the stepped structure of the exposure area SA. More specifically, on the basis of the step (interval d) within the exposure area SA shown in FIG. 10B, a step (interval $D_1$) is provided between the first area $R_{11}$ corresponding to the segmental area $W_{11}$ within the pattern forming area PA and the second area $R_{12}$ corresponding to the segmental area $W_{12}$. The interval $D_1$ is set to satisfy the formula (1). An optimum value thereof is desirably predetermined for each reticle beforehand by effecting the tests or simulations.

Figure 12A:
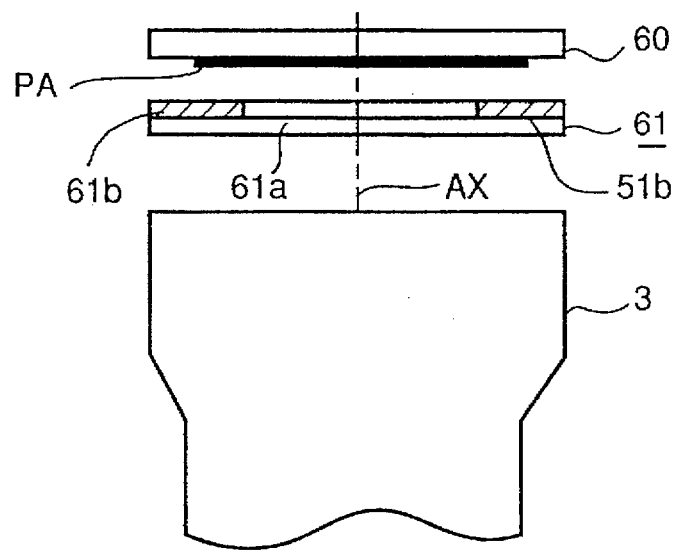
FIGS. 12A and 12B are views schematically illustrating a construction of the projection exposure apparatus of a sixth embodiment of the present invention.
Figure 12B:
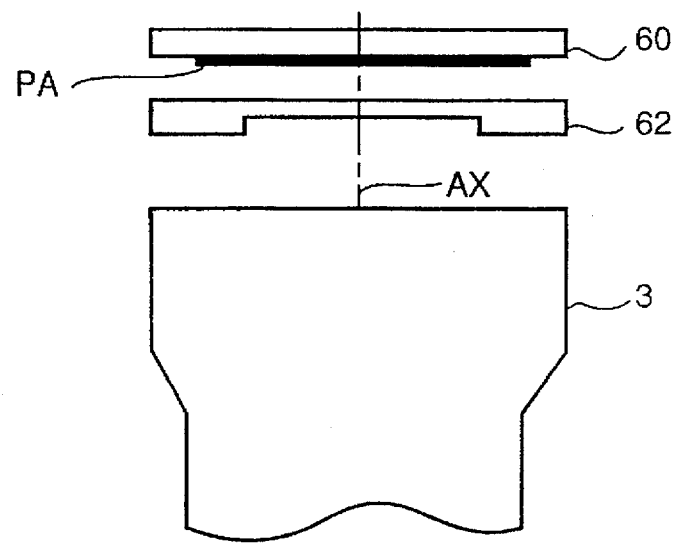

Next, a sixth embodiment of the present invention will be described with reference to FIGS. 12A and 12B. FIGS. 12A and 12B are views showing one example of the exposure apparatus in this embodiment. In the fifth embodiment (FIG. 8) discussed above, the reticle is employed as the image surface compensating member. In accordance with this embodiment, however, parallel flat glasses 61, 62 interposed between a reticle 60 and the projection optical system 3 are used as the image surface compensating members. Other features are the same as those of FIG. 8, and the description is therefore omitted herein. Further, the reticle 60 employed is the same as the conventional one.

Disposed, as illustrated in FIG. 12A, between the reticle 60 and the projection optical system 3 is the parallel flat glass 61 including at least one surface (only the upper surface in the figure) on which transparent films 61a, 61b having refractive indexes different from each other are deposited corresponding to the stepped structure within the exposure area in accordance with this embodiment. With this arrangement, it is also possible to make the image forming surface of the projection optical surface coincident substantially with the whole surface of the exposure area. In this case, it is desirable that the parallel flat glass 61 be disposed as close to the reticle 60 as possible. Further, it is also desirable that the transparent films of the parallel flat glass 61 be formed on the surface closer to the reticle 60. This is effective in terms of clearly separating the stepped portion of the image forming surface on the exposure area. Note that the transparent films 61a, 61b are deposited on the parallel flat glass to exhibit a predetermined distribution of refractive indexes in this embodiment. The distribution of refractive indexes may be, however, provided to the parallel flat glass itself by, e.g., ion implantation into the parallel flat glass and so on.

As depicted in FIG. 12B, the parallel flat glass 62 includes a step that is partially formed on at least one surface (only the lower surface in the figure) corresponding to the stepped structure within the exposure area. This parallel flat glass 62 may be disposed between the reticle 60 and the projection optical system 3. With this arrangement, it is feasible to make the image forming surface of the projection optical system coincident substantially with the whole surface of the exposure area. Herein, a step (interval) $D_3$ of the parallel flat glass 62 is given by the following formula:

$$D_3 = m^2 \times d/(n_3-1)$$

where $n_3$ is the refractive index of the parallel flat glass. Herein, it is also desirable to predetermine as optimum value thereof beforehand by performing tests and simulations. Further, the placement conditions of the parallel flat glass 62 are absolutely the same as those in the embodiment discussed above.

The embodiments discussed above have dealt with the arrangement wherein the two-stepped structure is provided on the wafer (exposure area) (viz., as illustrated in FIG. 10B, the exposure area SA is divided into two segmental areas $W_{11}$, $W_{12}$). As a matter of course, however, the invention is applicable with a; three or more stepped structure in which the steps (intervals d) are different from each other. In practice, the projection optical system 3 is desirably telecentric on the reticle side as well as on the wafer side. Further, the fifth and sixth embodiments (FIGS. 8 and 12) have been described by examples of the stepper. However the same effects can be obtained by applying the present invention to exposure apparatus (e.g., a mirror projection system may be provided) other than the stepper but including the projection optical system. Furthermore, there may be provided an exposure apparatus for effecting a batch exposure with an equi-magnification on the entire surface of a sensitive substrate (semiconductor wafer or a liquid crystal substrate). Also, the image surface compensating member according to the present invention is not limited to the reticle and the parallel flat glass. Any kind of image surface compensating members are provided on condition that they are capable of partially shifting the image forming surface of the projection optical system corresponding to a distortion of the image forming surface of the projection optical system and/or the stepped structure of the sensitive substrate. Namely, the image surface compensating member may be provided with a difference corresponding to the stepped structure or the like in terms of light path between the luminous fluxes $IL_1$, $IL_2$ emitted from the first and second areas $R_{11}$, $R_{12}$ within the pattern forming surface. Further, the reticle pattern may be composed of a light shielding portion (chrome or the like) and a light transmitting portion and may also include a phase shift portion for shifting a phase of transmitted light by π. Patterns having any kind of configurations may be provided.

Although the illustrative embodiments have been described in detail with reference to the accompanying drawings, it is to be noted that the present invention is not limited to those embodiments. Various changes or modifications may be effected by one skilled in the art without departing from the scope or spirit of the invention.

What is claimed is:

1. A photomask having a transparent substrate provided with a pattern of predetermined configuration and used for exposing said pattern onto a sensitive substrate through a projection optical system, said photomask comprising:
    an optical member which substantially shifts a part of an image forming surface of said projection optical system in a direction of an optical axis of the projection optical system, whereby the image forming surface of the projection optical system is caused simultaneously to be coincident with stepped portions of an exposure area of said sensitive substrate.

2. A photomask according to claim 1, wherein said optical member includes a recessed or protruded stepped-portion which is provided on a pattern forming surface of said transparent substrate.

3. A photomask according to claim 1, wherein said optical member includes a transmission member provided on a pattern forming surface of said transparent substrate and having an area of refractive index predetermined in accordance with the amount of shift of said part of the image forming surface.

4. A photomask according to claim 1, wherein said transmission member has first and second areas differing in at least one of refractive index and thickness by an amount predetermined in accordance with the amount of shift of said part of the image forming surface.

5. An exposure method for exposing a pattern onto a sensitive substrate having an exposure area with a stepped surface through a projection optical system, said method comprising the steps of:

arranging, at an object side of said projection optical system, an original substrate provided with said pattern and having an optical member for shifting a portion of an image forming surface of said projection optical system in an optical axis direction of said projection optical system in accordance with a stepped configuration of said stepped surface, such that the image forming surface of said projection optical system will be caused to be substantially coincident with said stepped surface when said exposure area is exposed with an image of said pattern;

arranging said sensitive substrate at an image side of said projection optical system; and exposing the image of said pattern on said exposure area through said projection optical system.

6. An exposure method for exposing a pattern formed on an original substrate onto a sensitive substrate having an exposure area with a stepped surface through a projection optical system, said method comprising the steps of:

arranging said original substrate and said sensitive substrate respectively at object and image sides of said projection optical system;

arranging, in an optical path between said original substrate and said sensitive substrate, an image surface correcting member for shifting a portion of an image forming surface of said projection optical system in an optical axis direction of said projection optical system in accordance with a stepped configuration of said stepped surface, such that the image forming surface of said projection optical system will be caused to be substantially coincident with said stepped surface when said exposure area is exposed with an image of said pattern; and exposing the image of said pattern on said exposure area through said projection optical system.

* * * * *